(12) United States Patent
Lai

(10) Patent No.: US 7,280,327 B2
(45) Date of Patent: Oct. 9, 2007

(54) MECHANISM FOR PREVENTING ESD DAMAGE AND LCD PANEL UTILIZING THE SAME

(75) Inventor: Han-Chung Lai, Jungli (TW)

(73) Assignee: Au Optronics Corp., Hsinchu (TW)

( * ) Notice: Subject to any disclaimer, the term of this patent is extended or adjusted under 35 U.S.C. 154(b) by 366 days.

(21) Appl. No.: 10/783,059

(22) Filed: Feb. 20, 2004

(65) Prior Publication Data

US 2005/0083621 A1 Apr. 21, 2005

(30) Foreign Application Priority Data

Oct. 21, 2003 (TW) .............................. 92129109 A

(51) Int. Cl.
*H02H 3/20* (2006.01)
*H02H 9/00* (2006.01)
*H02H 9/04* (2006.01)
(52) U.S. Cl. ...................... 361/56; 361/91.1; 361/111; 257/335
(58) Field of Classification Search ............... 361/91.1, 361/56, 111; 257/355, 335
See application file for complete search history.

(56) References Cited

U.S. PATENT DOCUMENTS

| 6,118,310 A | * | 9/2000 | Esch, Jr. ...................... 327/108 |
| 6,376,904 B1 | * | 4/2002 | Haba et al. .................. 257/686 |
| 6,678,133 B2 | * | 1/2004 | Roohparvar .................. 361/56 |
| 6,847,511 B2 | * | 1/2005 | Ohnakado et al. ............ 361/56 |
| 2002/0126430 A1 | | 9/2002 | Roohparvar .................. 361/58 |
| 2004/0026741 A1 | * | 2/2004 | Saito et al. .................. 257/355 |

* cited by examiner

*Primary Examiner*—Michael Sherry
*Assistant Examiner*—Zeev Kitov
(74) *Attorney, Agent, or Firm*—Thomas, Kayden, Horstemeyer & Risley

(57) ABSTRACT

A mechanism for preventing ESD damage and LCD panel utilizing the same. The mechanism for preventing ESD damage is configured to make ESD protection devices. The provided ESD protection devices corresponding to the longest fan-out signal lines of an integrated circuit have longer equivalent channel widths than those of the other ESD protection devices or smaller equivalent impedances than those of the other ESD protection devices, thereby discharging the electrostatic charge efficiently.

13 Claims, 5 Drawing Sheets

MECHANISM FOR PREVENTING ESD DAMAGE AND LCD PANEL UTILIZING THE SAME

BACKGROUND OF THE INVENTION

1. Field of the Invention

The present invention relates to ESD protection, and in particular to a mechanism for preventing ESD damage in an electronic device.

2. Description of the Related Art

FIG. 1 is a schematic diagram of signal lines of a conventional liquid crystal display (LCD) panel. The LCD panel comprises a pixel array 12, a plurality of connection areas 10 and a plurality of fan-out signal lines $F_1$ to $F_n$. Integrated circuits such as a data driver and a scan driver drive the pixel array 12 to display images. As shown in FIG. 1, each connection area 10 has a plurality of pads $P_1$ to $P_n$ arranged sequentially for mounting to the corresponding integrated circuit. The fan-out signal lines $F_1$ to $F_n$ are extend from the pads $P_1$ to $P_n$ respectively. The integrated circuits can provide driving signals, such as scan signals and data signals, to the pixel array 12 through the fan-out signal lines $F_1$ to $F_n$. Also, the integrated circuits can receive external signals through the fan-out signal lines $F_1$ to $F_n$.

A thin film transistor (TFT) LCD panel is handled by several machines and operators during the manufacturing process. When a machine or operator generates and transmits electrostatic discharge (ESD) to the TFT LCD panel, signal lines of the TFT LCD panel are open or short, resulting in reduced yield and damage to internal elements. The resulting TFT LCD panel displays abnormal bright or dark lines. TFT LCD panels typically comprise an ESD protection device to prevent ESD from damaging the TFT LCD panel.

Referring to FIG. 1, a conventional method of protecting an LCD panel provides a plurality of ESD protection devices $ES_1$ to $ED_n$ disposed corresponding to the fan-out signal lines $F_1$ to $F_n$. All the ESD protection devices usually have a virtually equal impedance. When ESD occurs in the TFT LCD panel, the ESD protection device of each signal line disposed on outermost side of the connection area 10 has the longest path. Therefore, the electrostatic charges do not disperse and the effectiveness of the protection offered by the ESD protection device is not maintained.

SUMMARY OF THE INVENTION

Accordingly, an object of the present invention is to provide a mechanism for preventing ESD damage in an electronic device, such as an LCD panel. The ESD protection devices corresponding to the longest fan-out signal lines of an integrated circuit have substantially longer equivalent channel widths than those of the other ESD protection devices or substantially smaller impedances than those of the other ESD protection devices.

Another object of the invention is to provide a mechanism for preventing ESD damage in an electronic device, such as an LCD panel. The ESD protection devices corresponding to the outermost sides of the connection area have the substantially smallest impedance and impedances of the other ESD protection devices gradually increase from the outermost sides of the connection area to the substantially center thereof, thereby discharging the electrostatic charge efficiently.

Another object of the invention is to provide a mechanism for preventing ESD damage in an electronic device, such as an LCD panel. Any ESD protection device corresponding to one fan-out signal line of an integrated circuit has an impedance substantially different from impedances of the other ESD protection devices, thereby discharging the electrostatic charge efficiently.

Another object of the invention is to provide an liquid crystal display panel utilizing the above mechanism for preventing ESD damages, thereby preventing the LCD panel from damaged by ESD.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
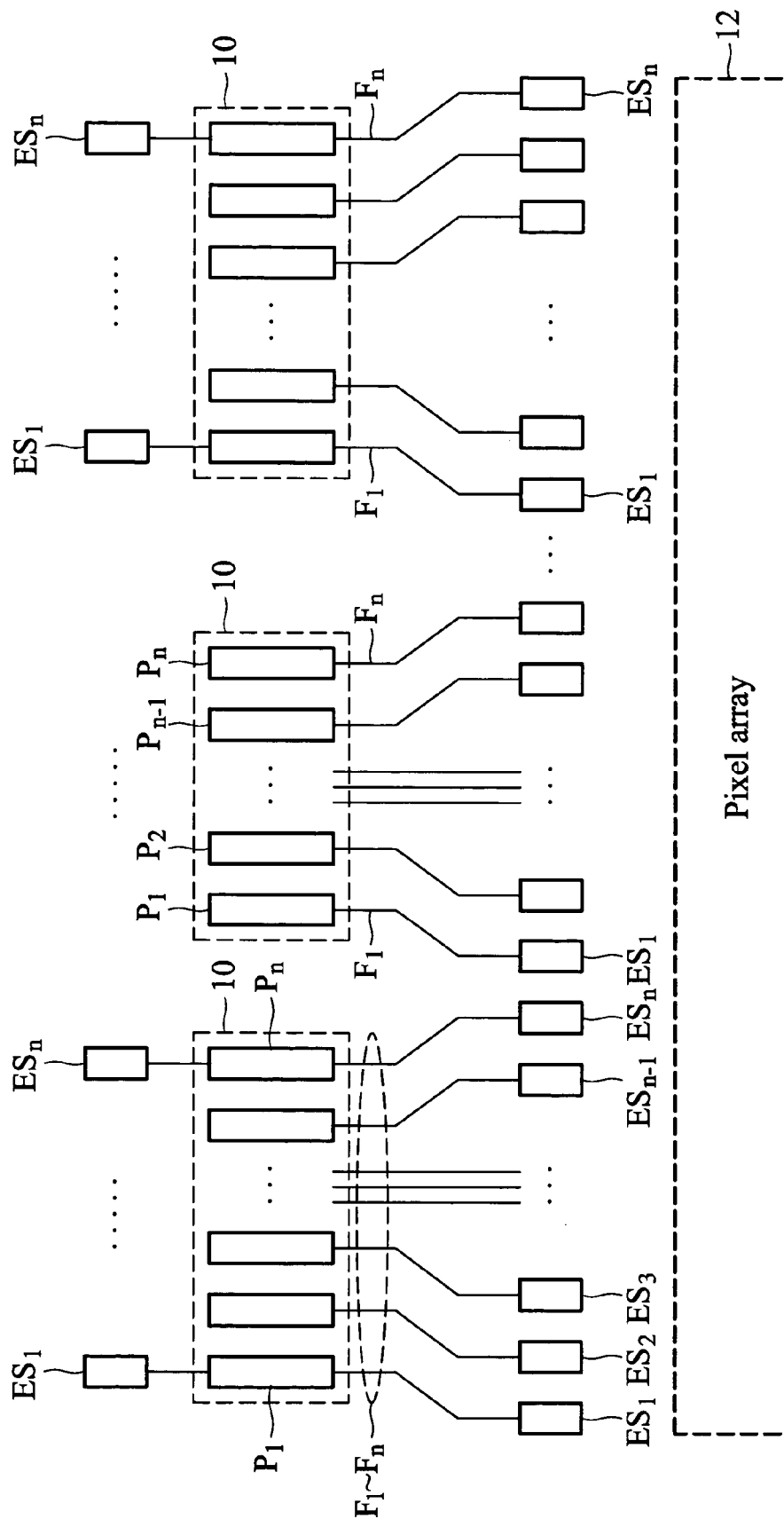
FIG. 1 is a schematic diagram of signal lines of a conventional liquid crystal display (LCD) panel.
Figure 2:
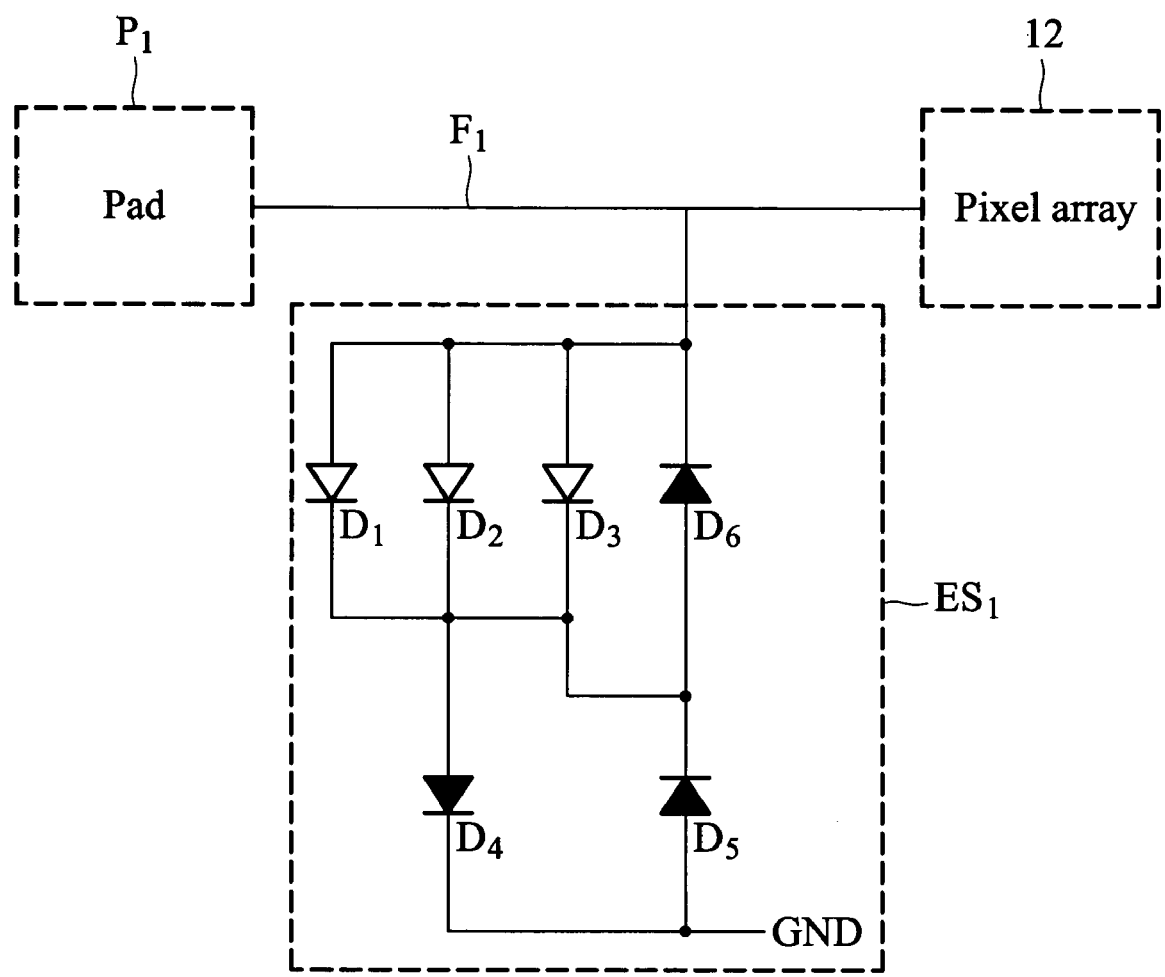
FIG. 2 shows an example of an ESD protection device composed by a diode circuit.

A diode circuit is always applied to an electronic device to serve as an electrostatic discharge (ESD) protection device. The ESD protection device $ES_1$ shown in FIG. 2 comprises six diodes $D_1$ to $D_6$ configured corresponding to the fan-out signal line $F_1$ in FIG. 1. Generally, two ESD protection devices $ES_1$ are respectively configured at two terminals of the pad $P_1$, but only one is shown in FIG. 2.

Figure 3:
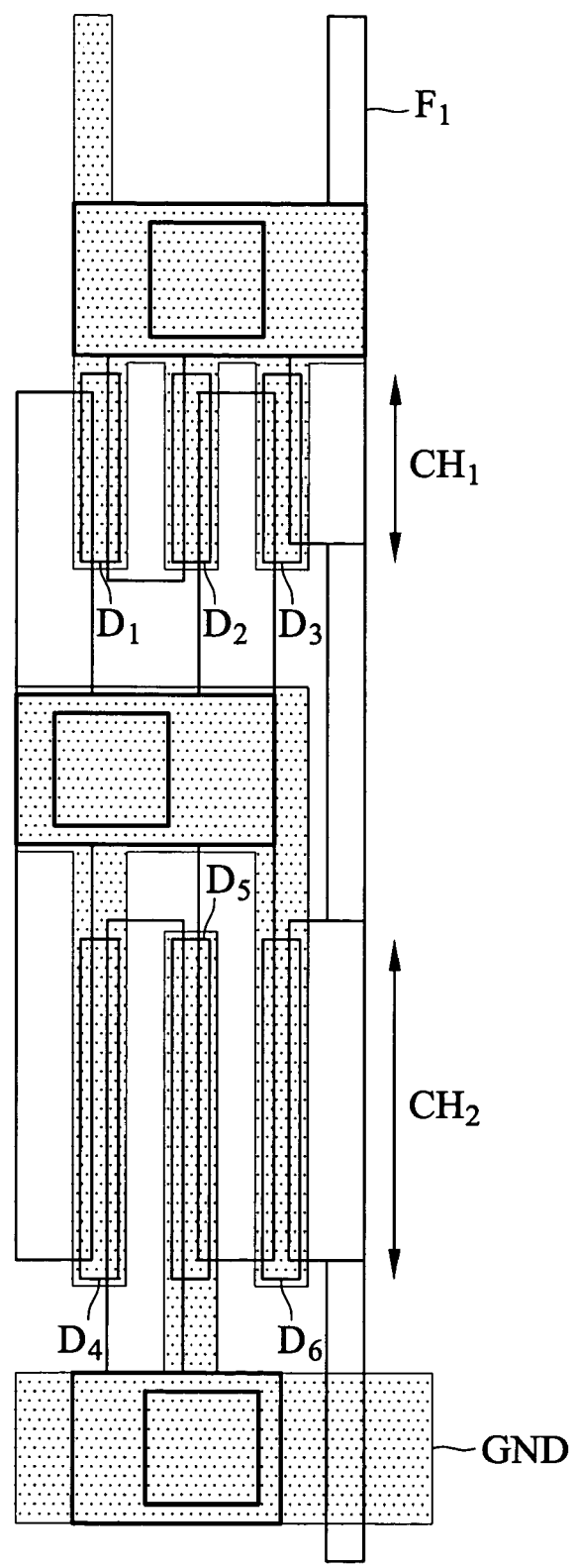
FIG. 3 shows layout of the diode circuit in FIG. 2.

The diodes $D_1$ to $D_6$ within the ESD protection devices $ES_1$ usually are typically composed by elements having MOS transistor circuit structures, such as a MOS transistor whose drain is coupled to its gate. FIG. 3 shows a circuit layout of diodes $D_1$ to $D_6$ in FIG. 2. As shown in FIG. 3, channel widths of the diodes $D_1$ to $D_3$ are CH1 while channel widths of the diodes $D_4$ to $D_6$ are CH2. An impedance of the ESD protection device $ES_1$ is determined according to the channel widths CH1 and CH2. That is, when an equivalent width composed of the channel widths CH1 and CH2 increases, the impedance of the ESD protection device $ES_1$ decreases.

FIRST EMBODIMENT

Figure 4:
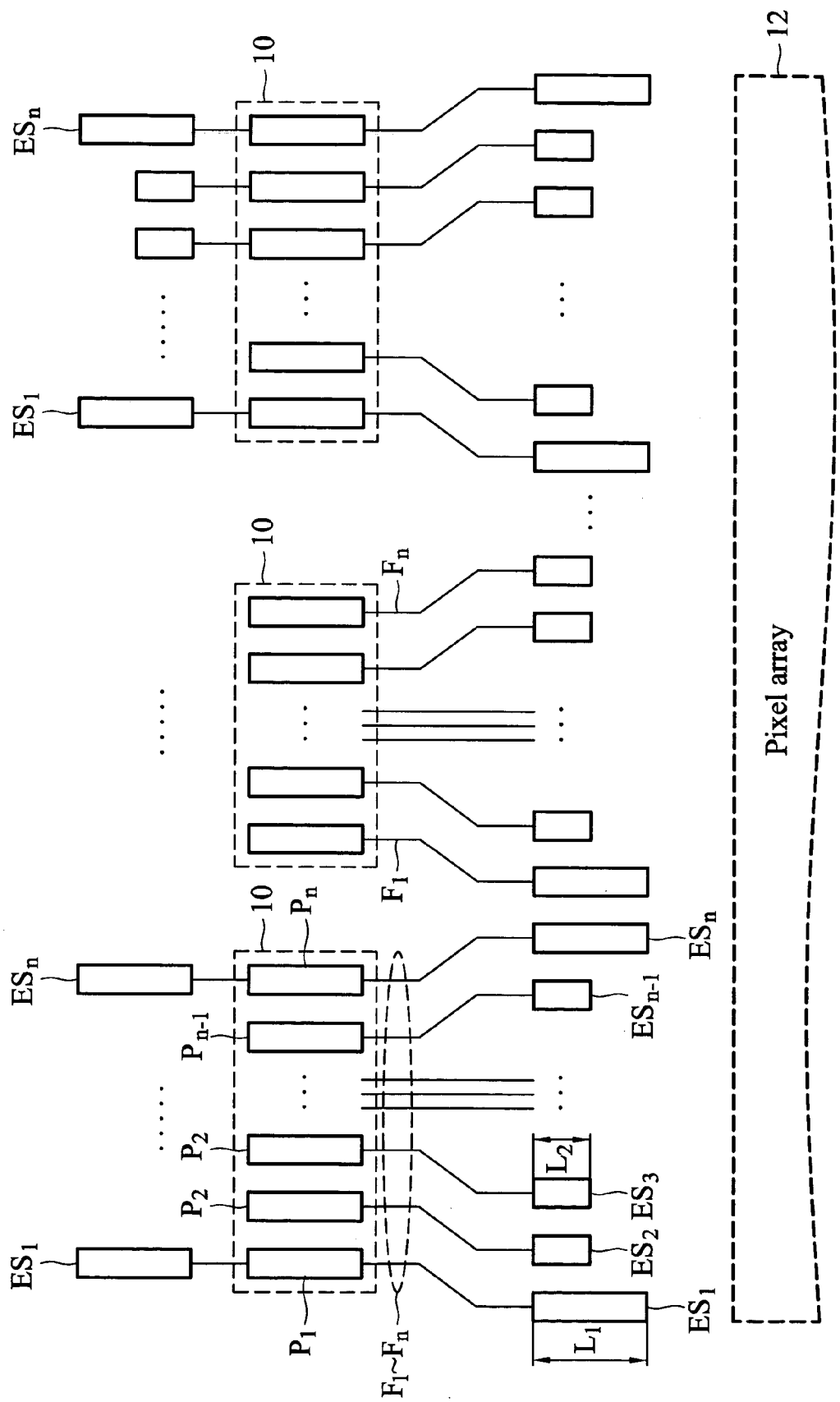
FIG. 4 shows an embodiment of a mechanism for preventing ESD damages in the present invention.

FIG. 4 shows an embodiment of a mechanism for preventing ESD damage in the present invention. The mechanism is applied to an electronic device, LCD panel.

The LCD panel comprises a pixel array 12, a plurality of connection areas 10, a plurality of fan-out signal lines $F_1$ to $F_n$, and a plurality of ESD protection devices $ES_1$ to $ED_n$. Each connection area 10 has a plurality of pads $P_1$ to $P_n$ arranged sequentially for mounting to one integrated circuit. The pads $P_1$ to $P_n$ are disposed on two outermost sides of the connection area 10. The fan-out signal lines $F_1$ to $F_n$ extend from the pads $P_1$ to $P_n$ respectively. The ESD protection devices $ES_1$ to $ED_n$ are disposed corresponding to the fan-out signal lines $F_1$ to $F_n$. In addition, each ESD protection device comprises a least one element having a MOS transistor circuit structure, such as a MOS transistor whose drain is coupled to its gate.

As shown in FIG. 4, impedances of the ESD protection devices $ES_1$ and $ED_n$ are designed to be substantially smaller than impedances of ESD protection devices $ES_2$ and $ED_{n-1}$. That is, an equivalent channel width $L_1$ of the ESD protection devices $ES_1$ and $ED_n$ is designed to be substantially longer than an equivalent channel width $L_2$ of ESD protection devices $ES_2$ and $ED_{n-1}$.

According to the embodiment, in one connection area 10, the equivalent of the ESD protection devices $ES_1$ and $ED_n$ are substantially small, that is the equivalent channel width $L_1$ of the ESD protection devices $ES_1$ and $ED_n$ is substantially longest. Therefore, accumulated electrostatic charges on the substantially longest fan-out signal lines $F_1$ and $F_n$ which do not easily disperse charges could be effectively dispersed through the ESD protection devices $ES_1$ and $ED_n$, preventing the LCD panel from ESD damage.

SECOND EMBODIMENT

Figure 5:
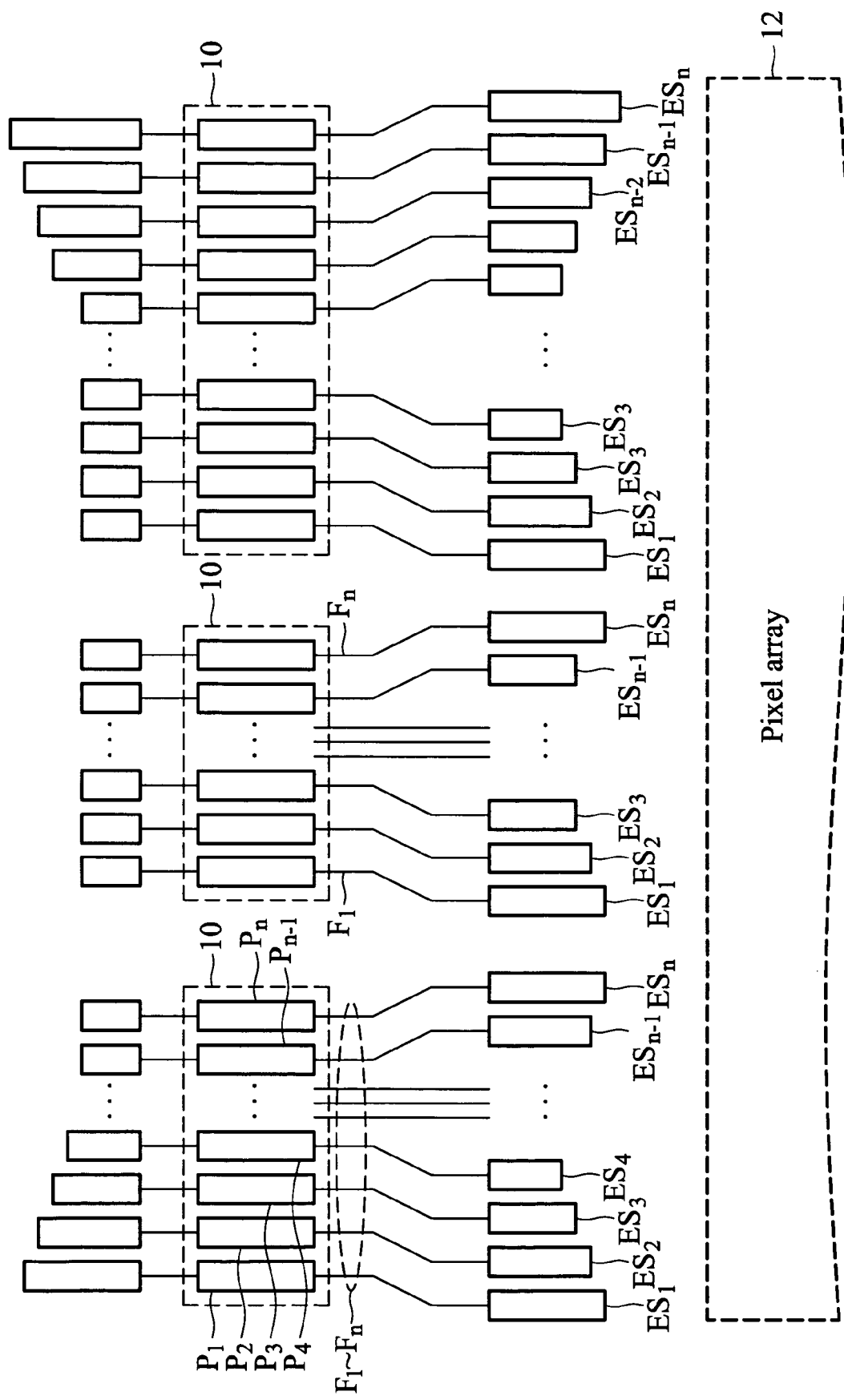
FIG. 5 shows another embodiment of a mechanism for preventing ESD damage in the present invention.

FIG. 5 shows another embodiment of a mechanism for preventing ESD damages in the present invention. The mechanism is applied to an electronic device, an LCD panel.

The LCD panel comprises a pixel array 12, a plurality of connection areas 10, a plurality of fan-out signal lines $F_1$ to $F_n$, and a plurality of ESD protection devices $ES_1$ to $ED_n$. Each connection area 10 has a plurality of pads $P_1$ to $P_n$ arranged sequentially for mounting to one integrated circuit. The pads $P_1$ to $P_n$ are disposed on two outermost sides of the connection area 10. The fan-out signal lines $F_1$ to $F_n$ extend from the pads $P_1$ to $P_n$ respectively. The ESD protection devices $ES_1$ to $ED_n$ are disposed corresponding to the fan-out signal lines $F_1$ to $F_n$. In addition, each ESD protection device comprises a least one element having a MOS transistor circuit structure, such as a MOS transistor whose drain is coupled to its gate.

As shown in FIG. 5, in one connection area 10, impedances of the ESD protection devices $ES_1$ to $ED_n$ gradually increase from the ESD protection devices $ES_1$ and $ED_n$ to the substantially center of the connection area 10. That is, equivalent channel widths of the ESD protection devices $ES_1$ to $ED_j$ gradually decrease and equivalent channel widths of the ESD protection devices $ES_{j+1}$ to $ED_n$ sequentially increase gradually.

According to the gradual decrease in the lengths of the fan-out signal lines from the two outermost sides of the connection area 10 to the substantially center thereof, the impedances of the ESD protection devices are designed to gradually increase. That is, the equivalent channel widths of the ESD protection devices gradually decrease from the two outermost sides of the connection area 10 to the substantially center thereof. Therefore, electrostatic charges could be effectively dispersed through the ESD protection devices $ES_1$ and $ED_n$, preventing the LCD panel from ESD damaged.

THIRD EMBODIMENT

The embodiment is a mechanism for preventing ESD damages of the present invention applied to an electronic device. Among all ESD protection devices $ES_1$ and $ED_n$, an impedance of one ESD protection device $ES_k$ ($1 \leq k \leq n$) is substantially different from these of the others. Each ESD protection device comprises at last one element having a MOS transistor circuit structure. Therefore, an equivalent channel width of the ESD protection device $ES_k$ is substantially different these of other protection devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mechanism for preventing ESD damage to a electronic device comprising at least one connection area having a plurality of pads ($P_1$ to $P_n$) arranged sequentially for mounting to an integrated circuit, and a plurality of fan-out signal lines ($F_1$ to $F_n$) extending from the pads ($P_1$ to $P_n$) respectively, the pads $P_1$ and $P_n$ disposed on outermost sides of the connection area, the mechanism comprising:
   a plurality of ESD protection device ($ES_1$ to $ES_n$) configured corresponding to the fan-out signal lines ($F_1$ to $F_n$);
   wherein, impedances of the ESD protection devices $ES_1$ and $ES_n$ are smaller than impedances of the other ESD protection devices $ES_2$ to $ES_{n-1}$.

2. The mechanism as claimed in claim 1, wherein each ESD protection device comprises at least one element having a MOS transistor circuit structure and equivalent channel widths of the ESD protection devices $ES_1$ and $ES_n$ are longer than equivalent channel widths of the other ESD protection devices $ES_2$ to $ES_{n-1}$.

3. A mechanism for preventing ESD damage to a electronic device comprising at least one connection area having a plurality of pads ($P_1$ to $P_n$) arranged sequentially for mounting to an integrated circuit, and a plurality of fan-out signal lines ($F_1$ to $F_n$) extending from the pads ($P_1$ to $P_n$) respectively, the pads $P_1$ and $P_n$ disposed on outermost sides of the connection area, the mechanism comprising:
   a plurality of ESD protection device ($ES_1$ to $ES_n$) configured corresponding to the fan-out signal lines ($F_1$ to $F_n$);
   wherein, equivalent impedances of the ESD protection devices $ES_1$ to $ES_j$ gradually increase and equivalent impedances of the ESD protection devices $ES_{j+1}$ to $ES_n$ gradually decrease, $1<j<n$.

4. The mechanism as claimed in claim 3, wherein each ESD protection device comprises at least one element having a MOS transistor circuit structure, equivalent channel widths of the ESD protection devices $ES_1$ to $ES_j$ gradually decrease, and equivalent channel widths of the ESD protection devices $ES_{j+1}$ to $ES_n$ gradually increase.

5. A mechanism for preventing ESD damage to a electronic device comprising at least one connection area having a plurality of pads ($P_1$ to $P_n$) arranged sequentially for mounting to an integrated circuit, and a plurality of fan-out signal lines ($F_1$ to $F_n$) extending from the pads ($P_1$ to $P_n$) respectively, the pads $P_1$ and $P_n$ disposed on outermost sides of the connection area, the mechanism comprising:
   a plurality of ESD protection device ($ES_1$ to $ES_n$) configured corresponding to the fan-out signal lines ($F_1$ to $F_n$);
   wherein, an equivalent impedance of one ESD protection device $ES_k$ is different from impedances of the other ESD protection devices, $1 \leq k \leq n$.

6. The mechanism as claimed in claim 5, wherein each ESD protection device comprises at least one element having a MOS transistor circuit structure and an equivalent channel width of the ESD protection device $ES_k$ is different from equivalent channel widths of the other ESD protection devices.

7. A liquid crystal display panel, comprising:
a pixel array;
at least one connection area having a plurality of pads ($P_1$ to $P_n$) arranged sequentially for mounting to an integrated circuit, wherein the pads $P_1$ and $P_n$ are disposed on outermost sides of the connection area;
a plurality of fan-out signal lines ($F_1$ to $F_n$) extending from the pads ($P_1$ to $P_n$) respectively; and
a plurality of ESD protection devices ($ES_1$ to $ES_n$) configured corresponding to the fan-out signal lines ($F_1$ to $F_n$);
wherein, equivalent impedances of the ESD protection devices $ES_1$ and $ES_n$ are smaller than impedances of the other ESD protection devices $ES_2$ to $ES_{n-1}$.

8. The liquid crystal display panel as claimed in claim 7, wherein each ESD protection device comprises at least one element having a MOS transistor circuit structure and equivalent channel widths of the ESD protection devices $ES_1$ and $ES_n$ are longer than equivalent channel widths of the other ESD protection devices $ES_2$ to $ES_{n-1}$.

9. The liquid crystal display panel as claimed in claim 8, wherein the equivalent channel widths of the ESD protection devices $ES_1$ to $ES_j$ gradually decrease, and the equivalent channel widths of the ESD protection devices $ES_{j+1}$ to $ES_n$ gradually increase, 1<j<n.

10. A liquid crystal display panel, comprising:
a pixel array;
at least one connection area having a plurality of pads ($P_1$ to $P_n$) arranged sequentially for mounting to an integrated circuit, wherein the pads $P_1$ and $P_n$ are disposed on outermost sides of the connection area;
a plurality of fan-out signal lines ($F_1$ to $F_n$) extending from the pads ($P_1$ to $P_n$) respectively; and
a plurality of ESD protection device ($ES_1$ to $ES_n$) configured corresponding to the fan-out signal lines ($F_1$ to $F_n$);
wherein, an equivalent impedance of one ESD protection device $ES_k$ is different from impedances of the other ESD protection devices, $1 \leq k \leq n$.

11. The liquid crystal display panel as claimed in claim 10, wherein each ESD protection device comprises at least one element having a MOS transistor circuit structure and an equivalent channel width of the ESD protection device $ES_k$ is different from equivalent channel widths of the other ESD protection devices.

12. The liquid crystal display panel as claimed in claim 10, wherein each ESD protection device comprises at least one element having a MOS transistor circuit structure and equivalent channel widths of the ESD protection devices $ES_1$ and $ES_n$ are longer than equivalent channel widths of the other ESD protection devices $ES_2$ to $ES_{n-1}$.

13. The liquid crystal display panel as claimed in claim 12, wherein the equivalent channel widths of the ESD protection devices $ES_1$ to $ES_j$ gradually decrease, and the equivalent channel widths of the ESD protection devices $ES_{j+1}$ to $ES_n$ gradually increase, 1<j<n.

* * * * *